United States Patent [19]

Painter

[11] Patent Number: 4,594,644
[45] Date of Patent: Jun. 10, 1986

[54] ELECTRICAL COMPONENT ENCAPSULATION PACKAGE

[75] Inventor: Robert A. Painter, Winchester, Mass.

[73] Assignee: Electronic Instrument & Specialty Corp., Stoneham, Mass.

[21] Appl. No.: 663,353

[22] Filed: Oct. 22, 1984

[51] Int. Cl.⁴ .............................................. H02B 1/04
[52] U.S. Cl. ...................................... 361/417; 361/392; 336/96; 335/202; 174/52 PE
[58] Field of Search .................. 174/525, 52 PE; 335/202, 278; 361/380, 392, 395, 399, 417, 419, 429, 400; 336/96; 338/256, 7, 275, 269, 270, 253

[56] References Cited

U.S. PATENT DOCUMENTS

| | | | |
|---|---|---|---|
| 2,829,426 | 4/1958 | Franklin | 339/96 |
| 3,838,316 | 9/1974 | Brown | 174/52 PE |
| 4,177,439 | 12/1979 | Smith | 335/202 |
| 4,185,163 | 1/1980 | Schedele | 335/202 |
| 4,335,932 | 6/1982 | Herrmann, Jr. | 174/52 PE |
| 4,366,345 | 12/1982 | Jalgle | 174/52 PE |
| 4,507,633 | 3/1985 | Minks | 335/278 |
| 4,528,616 | 7/1985 | Koppensteiner | 361/399 |

Primary Examiner—G. P. Tolin
Attorney, Agent, or Firm—Joseph S. Iandiorio; William E. Noonan

[57] ABSTRACT

An electrical component encapsulation package including a cover; a base including a peripheral frame with a large central hole; and support means for mounting the electrical component above and spaced from the frame for providing an open space between the frame and component for introduction and flow of encapsulating material, and to insure integrity of the electrical connections.

8 Claims, 11 Drawing Figures

ELECTRICAL COMPONENT ENCAPSULATION PACKAGE

FIELD OF INVENTION

This invention relates to an encapsulation package for electrical components, and more particularly to such a package which totally seals the components without leaks and voids.

BACKGROUND OF INVENTION

Electrical components such as integrated circuits, reed relays and the like are often encapsulated to seal against moisture and thus control capacitance, prevent deterioration of materials and achieve high insulation resistance. Encapsulation also helps dissipate heat, minimizes thermally generated voltage and cements parts together providing strength and resisting damage. In conventional encapsulating procedures, the components are mounted on a solid base and the cover is inverted and partially filled with the encapsulating material. The base is then inverted and mounted in the cover and the entire assembly is turned right side up so that the encapsulating material flows down and seals between the cover and base. This technique sometimes results in empty spaces or in the encapsulant failing to seal around terminals because the cover has been insufficiently filled or the encapsulating material does not flow properly. This may be due to a delay in processing which permitted the encapsulant to begin curing before the assembly was inverted. In either case, the sealing between the cover and base may be incomplete due to voids in the encapsulating material. Any incomplete sealing allows moisture to enter and renders the units unable to withstand the use of water and detergents in final fabrication washes.

SUMMARY OF INVENTION

It is therefore an object of this invention to provide an improved encapsulating package and technique which is simple, inexpensive and reliable.

It is a further object of this invention to provide such a package and technique which enables assembly of the components on the base before installation of the cover.

It is a further object of this invention to provide such a package which allows introduction of the encapsulation material from the base, thereby leaving the cover available for conventional marking and identification.

It is a further object of this invention to provide such a package and technique which provides a large fill hole that allows fast filling and full penetration of the encapsulation material.

It is a further object of this invention to provide such a package and technique which provides a large fill hole that allows air to escape easily during the filling process and prevents formation of voids.

The invention results from the realization that a simple and truly effective encapsulating package can be made by mounting the components spaced above the base and providing a large hole in the base with open space between the components and base for introduction and flow of encapsulating material.

The invention relates to an electrical component encapsulation package having a cover and a base. The base includes a peripheral frame with a large central hole. There are support means for mounting the electrical component above and spaced from the frame for providing an open space between the frame and component for introduction and flow of encapsulating material. In a preferred embodiment, the support means are integral with the frame or integral with the component or may be separate means or may be the electrical connection pins which are provided in the frame for electrical connection between the encapsulated component and the external environment. The frame may include a raised section which extends about the frame and forms a shoulder for centering and sealing the cover.

DISCLOSURE OF PREFERRED EMBODIMENT

Other objects, features and advantages will occur from the following description of a preferred embodiment and the accompanying drawings, in which.

Figure 1:
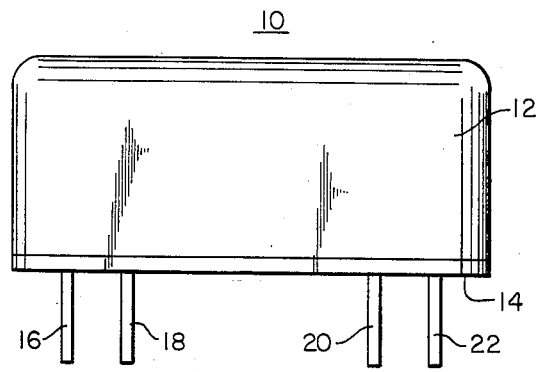
FIG. 1 is a side elevational view of an encapsulation package according to this invention.
Figure 3:
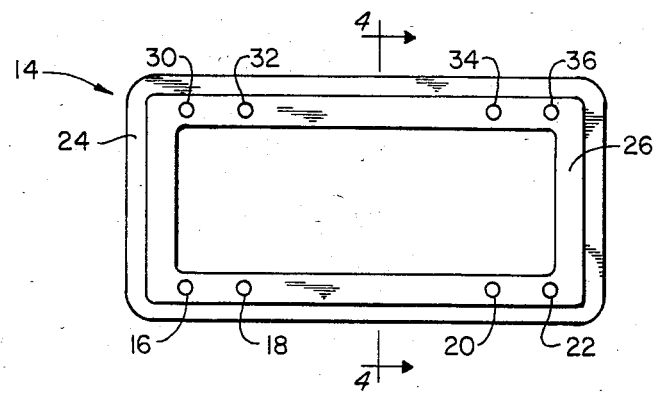
FIG. 3 is a plan view of the base of FIGS. 1 and 2.
Figure 4:
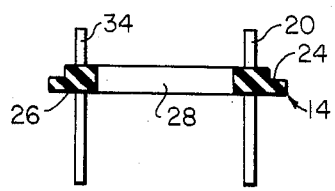
FIG. 4 is a sectional view along lines 4—4 of FIG. 3.

There is shown in FIG. 1 an encapsulation package 10 according to this invention having a cover 12 and a base 14 through which a number of electrical connection pins 16, 18, 20 and 22 protrude. Cover 12 engages shoulder 24, FIG. 2, which surrounds the edge of base 14. Base 14 is formed of a peripheral frame 26, which contains a large central opening or hole 28, FIGS. 3 and 4. Another set of four electrical connection pins 30, 32, 34 and 36, hidden by the electrical connection pins 16, 18, 20 and 22, in FIG. 1, are visible in FIG. 3. Also shown in FIG. 2 is a reed relay bobbin 40 mounted with supports 42 and 44 which bridge hole 28 and rest on opposite edges of peripheral frame 26, FIG. 2.

Figure 2:
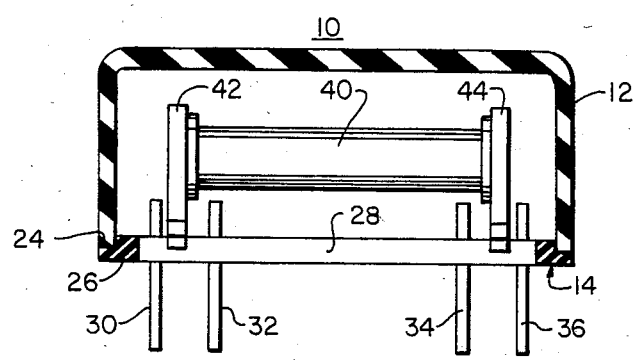
FIG. 2 is a cross-sectional view of FIG. 1 showing a reed relay bobbin mounted therein.
Figure 5:
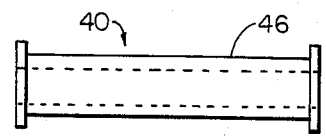
FIG. 5 is a side elevational view of a reed relay bobbin.
Figure 6:
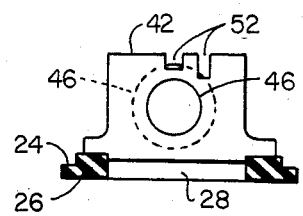
FIG. 6 is a broken away end view of the base of FIGS. 1, 2, 3, and 4, with the pins omitted and with the bobbin of FIG. 5 mounted showing the end supports.

Reed relay bobbin 40, FIG. 5, includes a hollow cylinder 46 which contains the winding and a pair of support end plates 42 and 44, FIG. 2. At least one of the end plates 42 of the bobbin 40, FIG. 6, has one or more grooves 52 for receiving the wire from bobbin 40 and connecting it to the electrical connection pins.

Figure 7:
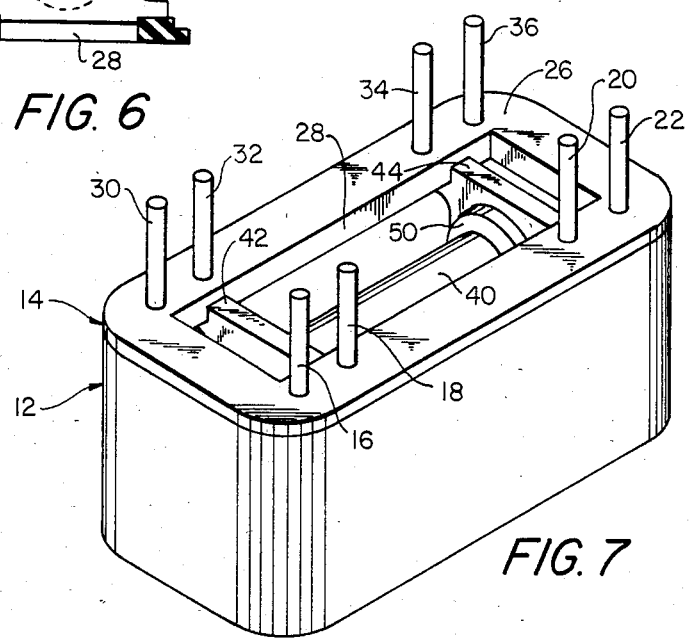
FIG. 7 is an axonometric view of the inverted encapsulation package as shown in FIG. 1, with the bobbin and support mounts viewable through the hole in the base.
Figure 8:
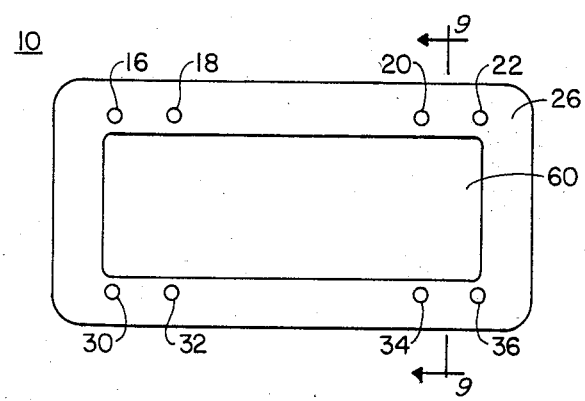
FIG. 8 is a bottom plan view of the encapsulation package of FIG. 7 filled with encapsulation material.
Figure 9:
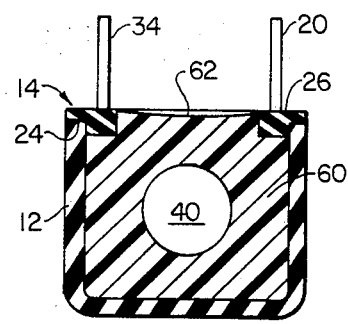
FIG. 9 is a cross-sectional view taken along 9—9 of FIG. 8 with the bobbin shown only as a solid cylinder for simplification.

When the bobbin is mounted to the base, the base with the bobbin and the cover are mounted together and inverted, as shown in FIG. 7, so that the encapsulating material 60, FIGS. 8 and 9, such as epoxy or urethane can be poured in. Hole 28 is large and bobbin 40 is spaced from frame 26 by support plates 42 and 44 so there are large openings and easy access available to the encapsulating liquid to flow in and around the components without trapping air and causing voids. The space about the components, for example, bobbin 40, is illustrated in the cross-sectional view in FIG. 9, where the encapsulated material 60 has started to solidify and the miniscus 62 has formed.

Figure 10:
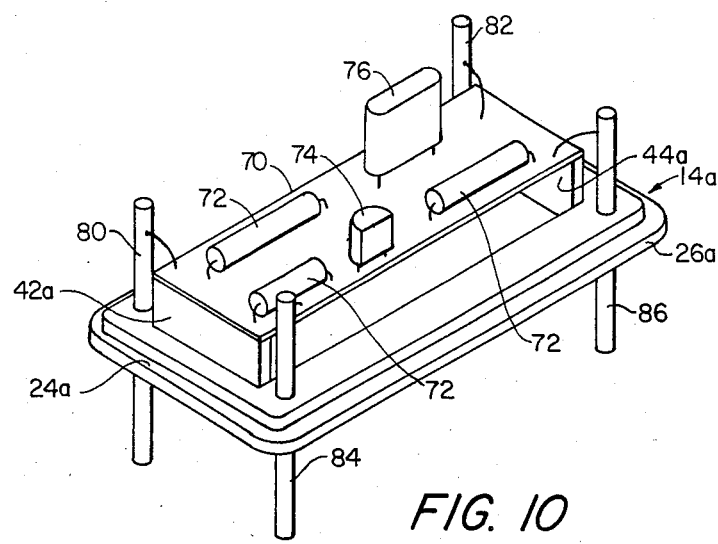
FIG. 10 is an axonometric view of an alternative assembly of components which may be encapsulated in the package of FIG. 1.
Figure 11:
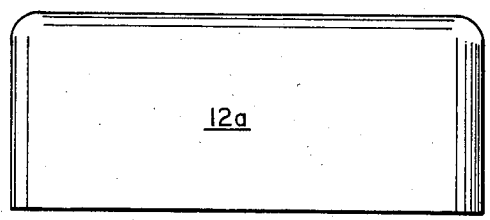
FIG. 11 is a side elevational view of the base and components of FIG. 10 with the cover exploded above it.
Figure 11:
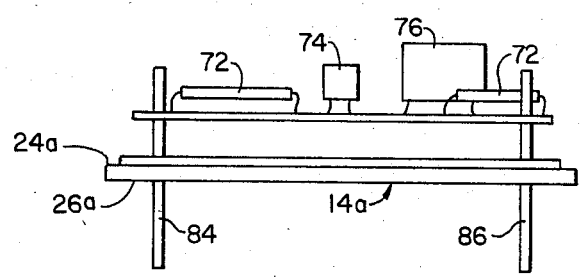

The component to be encapsulated is not limited to a reed relay bobbin. For example, the component may be an entire circuit board 70, FIG. 10, which includes on it resistors 72, transistors 74 and a capacitor 76, all mounted on the circuit board 70 which may be supported above frame 26a of base 14a by means of mounting plates or support plates 42a and 44a which may be integral with the circuit board 70 or with frame 26a or with neither. Electrical connection pins 80, 82, 84 and 86 are provided in frame 26a to bring out the electrical connections from circuit board 70. Alternatively, as shown in FIG. 11, the mounting plates 42a and 44a may be eliminated in their function provided by electrical connection pins 80, 82, 84 and 86 which will double as electrical connectors and mechanical supports.

Other embodiments will occur to those skilled in the art and are within the following claims:

I claim:

1. An electrical component encapsulation package comprising: a cover; a base including a peripheral frame removable engaging said cover and having a large central hole and a channel which includes a first surface removably engaging the bottom edge surface of said cover and a second surface removably engaging the inside surface of said cover for centering and sealing the cover; an electrical component; and non-conductive support means integral with said electrical component and connected to said frame and mounting said component above and spaced from said frame and providing an open space between the frame and component which is filled by encapsulating material.

2. The package of claim 1 in which electrical connection pins are mounted on said frame.

3. The package of claim 1 in which said support means include a raised section of said frame.

4. The package of claim 1 in which said frame includes a raised section which extends about said frame and forms a shoulder for centering and sealing said cover.

5. An electrical component encapsulation package comprising: a cover; a base including a peripheral frame removably engaging said cover and having a large central hole and a channel which includes a first surface removably engaging the bottom edge surface of said cover and a second surface removably engaging the inside surface of said cover for centering and sealing the cover; an electrical component; and nonconductive support means integral with said frame and connected to said component and mounting said component above and spaced from said frame and providing an open space between the frame and the component which is filled by encapsulating material.

6. The package of claim 5 in which electrical connection pins are mounted on said frame.

7. The package of claim 5 in which said support means include a raised section of said frame.

8. The package of claim 5 in which said frame includes a raised section which extends about said frame and forms a shoulder for centering and sealing said cover.

* * * * *